(12) United States Patent
Ono

(10) Patent No.: US 7,844,883 B2
(45) Date of Patent: Nov. 30, 2010

(54) REGENERATIVE RELAY SYSTEM AND REGENERATIVE RELAY APPARATUS

(75) Inventor: Takeshi Ono, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1215 days.

(21) Appl. No.: 11/284,210

(22) Filed: Nov. 21, 2005

(65) Prior Publication Data

US 2006/0080581 A1 Apr. 13, 2006

Related U.S. Application Data

(63) Continuation of application No. PCT/JP03/09928, filed on Aug. 5, 2003.

(51) Int. Cl.
*H03M 13/00* (2006.01)
(52) U.S. Cl. ...................................... 714/776
(58) Field of Classification Search .................. 714/776
See application file for complete search history.

(56) References Cited

U.S. PATENT DOCUMENTS

| | | | | |
|---|---|---|---|---|
| 5,509,020 | A * | 4/1996 | Iwakiri et al. | 714/704 |
| 5,839,077 | A | 11/1998 | Kowaguchi | |
| 5,864,611 | A * | 1/1999 | Ching et al. | 379/134 |
| 5,907,563 | A | 5/1999 | Takeuchi et al. | |
| 6,043,946 | A * | 3/2000 | Genheimer et al. | 360/53 |
| 6,526,531 | B1 * | 2/2003 | Wang | 714/704 |
| 6,856,771 | B2 | 2/2005 | Taga et al. | |
| 2001/0015844 | A1 | 8/2001 | Takehana | |
| 2002/0063934 | A1 | 5/2002 | Sakauchi | |
| 2003/0202805 | A1 | 10/2003 | Taga et al. | |
| 2004/0165894 | A1 | 8/2004 | Taga et al. | |

FOREIGN PATENT DOCUMENTS

| | | |
|---|---|---|
| JP | 3-159421 | 7/1991 |
| JP | 3-274937 | 12/1991 |
| JP | 9-116486 | 5/1997 |
| JP | 9-298526 | 11/1997 |
| JP | 2000-341344 | 12/2000 |
| JP | 2001-186061 | 7/2001 |
| JP | 2002-164846 | 6/2002 |
| WO | WO 9931838 A1 * | 6/1999 |

OTHER PUBLICATIONS

International Search Report dated Sep. 9, 2003.

* cited by examiner

*Primary Examiner*—Scott T Baderman
*Assistant Examiner*—Enam Ahmed
(74) *Attorney, Agent, or Firm*—Fujitsu Patent Center

(57) ABSTRACT

A regenerative relay method includes the steps of: i) calculating an error rate of a transmission path between the first half apparatus and a main apparatus; ii) calculating an error rate of a transmission path between the main apparatus and the latter apparatus; iii) adding the error rates; iv) selecting the error correction code and data before the error is corrected in the main apparatus so as to be supplied to the latter apparatus if the added error rates are lower than a designated error correction threshold; and v) selecting data after the error is corrected in the main apparatus and the other error correction code generated from the data so as to be supplied to the latter apparatus if the added error rates are higher than the designated error correction threshold.

4 Claims, 13 Drawing Sheets

REGENERATIVE RELAY SYSTEM AND REGENERATIVE RELAY APPARATUS

CROSS-REFERENCE TO RELATED APPLICATION

This application is a U.S. continuation application filed under 35 USC 111(a) claiming benefit under 35 USC 120 and 365(c) of PCT application JP2003/009928, filed Aug. 5, 2003. The foregoing applications are hereby incorporated herein by reference.

BACKGROUND OF THE INVENTION

1. Field of the Invention

The present invention generally relates to regenerative relay methods and regenerative relay apparatuses, and more specifically, to a regenerative relay method and regenerative relay apparatus whereby, for example, a regenerative relay of a signal is implemented in an optical transmission system such as a Dense Wavelength Division Multiplexer (DWDM) system.

2. Description of the Related Art

Recently and continuing, due to the increase of communications capability, a large amount of data can be transmitted by a transmission apparatus and long distance transmission of data can be done. In this state, an efficient optical transmission system using Wavelength Division Multiplexing is utilized. In this Wavelength Division Multiplex transmission, deterioration of light often happens due to mixing of noise by the optical amplifier, light dispersion or polarization by a long distance transmission, or the like. Because of this, instead of use of an expensive compensator or low noise amplifier, an error correction function whereby a signal is encoded by adding a redundancy bit and the signal is decoded at a receiving side, has been used.

An S/N ratio improved by the error correction is generally called a coding gain. Various kinds of error correction have been developed depending on their coding rules or the number of the redundancy bits. Generally, as the coding gain is larger, that is, the error correction ability is higher, the number of the redundancy bits is bigger, circuit size is bigger, delay time is longer, and consumption of electric power is larger.

Transmission capacity has been recently extremely improved so that a transmission capacity of 10 Gbit/s or 40 Gbit/s has been utilized. Therefore, an error correction method wherein the number of the redundancy bits, the circuit size, the delay time, and the consumption of electric power are respectively small but the coding gain is large in demanded.

In addition, an INVERSE-MUX method has been used. According to this method, a signal having a larger capacity is divided into plural routes and transmitted so that the signal is multiplexed at a transmitted side and the original signal is regenerated. In this method, for example, in order to divide and transmit a signal having a capacity of 40 Gbit/s into four routes of 10 Gbit/s each and then multiplex to generate the signal having a capacity of 40 Gbit/s again, it is necessary to minimize the differences of the delay times of the transmitted four routes and therefore the delay time is increased due to the number of the relay apparatuses of the respective routes.

FIG. 1 is a block diagram of an example of a related art transmission system. Referring to FIG. 1, in a terminal apparatus 10, a redundancy bit is added to a client signal by using an encoding part 12 so that the client signal is encoded. The coded signal is converted to an optical signal by an electric/optical conversion part 14. The converted optical signal is multiplexed by an optical wavelength multiplexer 16 so as to be sent out to a transmission path at a network side.

The optical multiplex signal that is sent out is optical-level generated by an optical amplifier (ILA) $17_1$, $17_2$, and $17_3$ arranged on the transmission path of the network so as to be transmitted. In addition, the signals are divided into individual optical signals by an optical wavelength divider 18 so as to be transmitted to a regenerative relay apparatus 20.

In the regenerative relay apparatus 20, the signal converted to the electric signal by the optical/electric conversion part 22 is decoded so that the error correction is made and the signal is regenerated by the signal generation part 26. After that, a redundancy bit is added again by an encoding part 28 so that the signal is encoded. The signal is converted to an optical signal by an electric/optical conversion part 30, and then the signal is multiplexed by an optical wavelength multiplexer 32 so as to be sent out to the transmission path at the network side. The signal is transmitted to a terminal apparatus 34 situated in a remote position by repeating this process. In the terminal apparatus receiving the signal, after the error correction is made, the signal is used as a transmission signal to the client.

In the meantime, Japan Laid-Open Patent Application Publication No. 2000-341344 discloses that a signal converted to an electric signal by a light receiving element is binarized and demultiplexed into n-channels by a comparator, errors of the binarized signals of respective channels are corrected by an error correction circuit, a total error number obtained by counting the number of the errors of the channels is supplied to a threshold value control circuit, the threshold control circuit allows a threshold generation circuit to generate plural thresholds used by the comparator, and an optimum threshold is determined on the basis of the total error number.

In the related art transmission system, decoders having constant error correction abilities regardless of the transmission path qualities are provided in the regenerative relay apparatus and the terminal apparatus. Therefore, the signal passes through the decoder even at a section where the number of errors is small so that signal delay by the decoder and the encoder is increased.

SUMMARY OF THE INVENTION

Accordingly, it is a general object of the present invention to provide a novel and useful regenerative relay method and regenerative relay apparatus.

Another and more specific object of the present invention is to provide a regenerative relay method and regenerative relay apparatus whereby a necessary error correction is made without increasing delay time and good transmission quality can be secured.

The above object of the present invention is achieved by a regenerative relay method wherein data to which an error correction code is added are transmitted from a first half apparatus so that an error correction is made, and another error correction code is generated from the data after the error is corrected so as to be transferred to a latter apparatus, the method including the steps of:

calculating an error rate of a transmission path between the first half apparatus and a main apparatus;

calculating an error rate of a transmission path between the main apparatus and the latter apparatus;

adding the error rates;

selecting the error correction code and data before the error is corrected in the main apparatus so as to be supplied to the latter apparatus if the added error rates are lower than a designated error correction threshold; and selecting data after the error is corrected in the main apparatus and the other error correction code generated from the data so as to be supplied to the latter apparatus if the added error rates are higher than the designated error correction threshold.

According to the present invention, it is possible to make a necessary error correction without increasing delay time and secure good transmission quality.

Other objects, features, and advantages of the present invention will be come more apparent from the following detailed description when read in conjunction with the accompanying drawings.

DETAILED DESCRIPTION OF THE PREFERRED EMBODIMENTS

A description is given below, with reference to the FIG. 2 through FIG. 13 of embodiments of the present invention.

First Embodiment of the Present Invention

Figure 1:
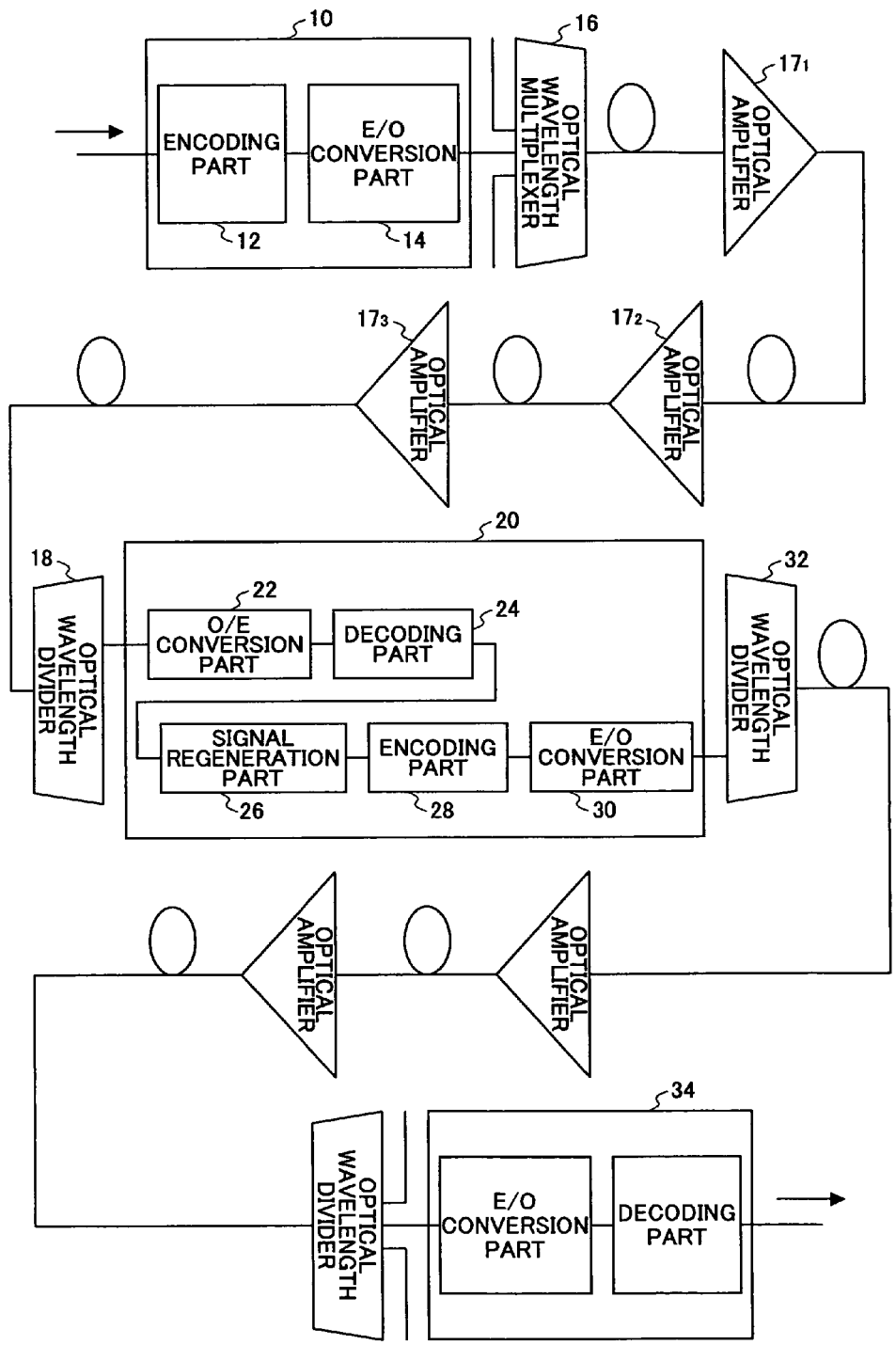
FIG. 1 is a block diagram of an example of a related art transmission system.
Figure 2:
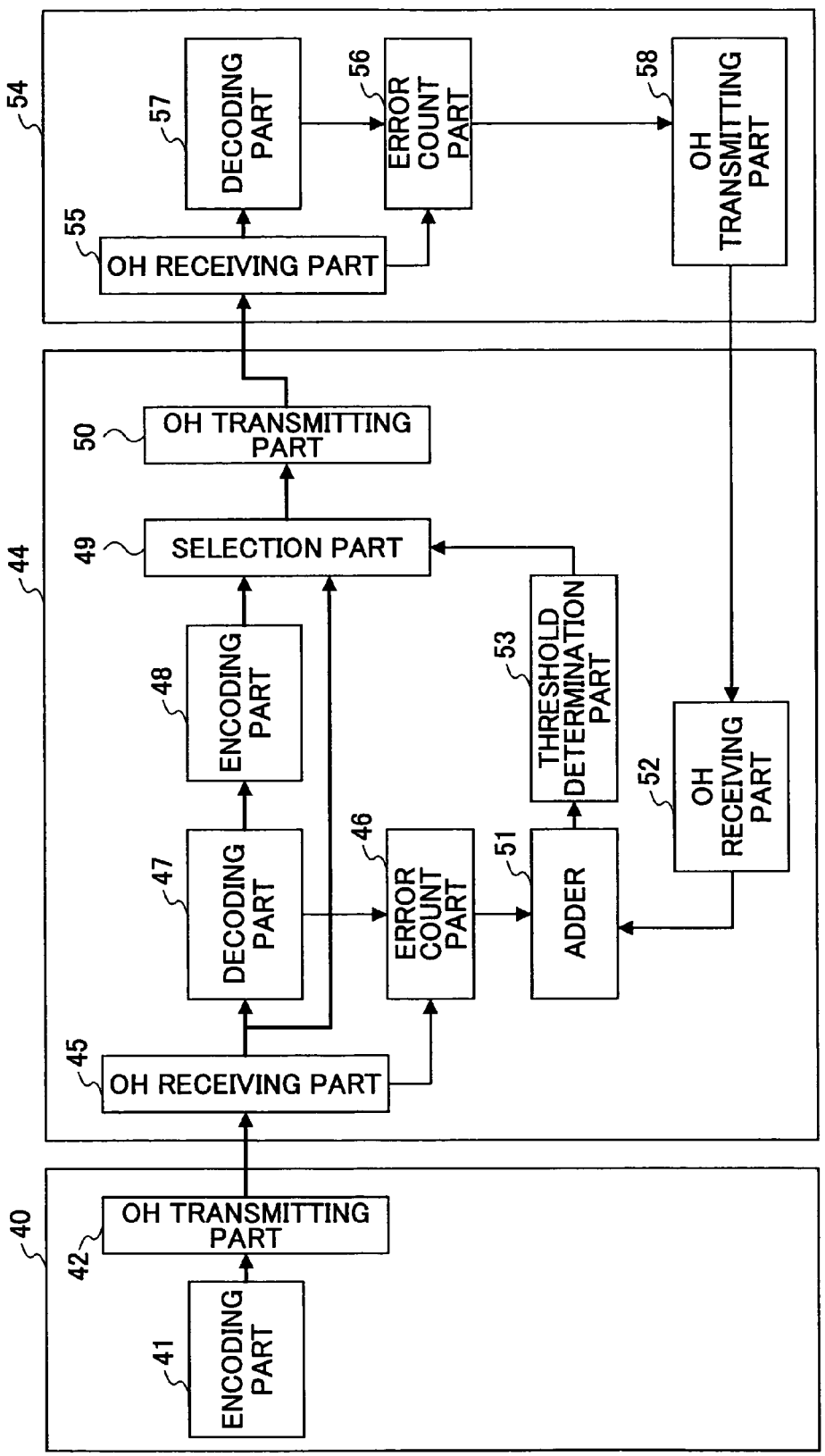
FIG. 2 is a structural view of a first embodiment of a relay method of the present invention.

FIG. 2 is a structural view of a first embodiment of a relay method of the present invention. Referring to FIG. 2, an error correction code that is a redundancy bit for error correction is added to a signal in an encoding part 41 of a terminal apparatus 40. Overhead is added to the signal by an OH transmission part 42 so as to be transmitted to a regenerative relay apparatus 44 via a going-up (upstream) circuit.

Figure 3:
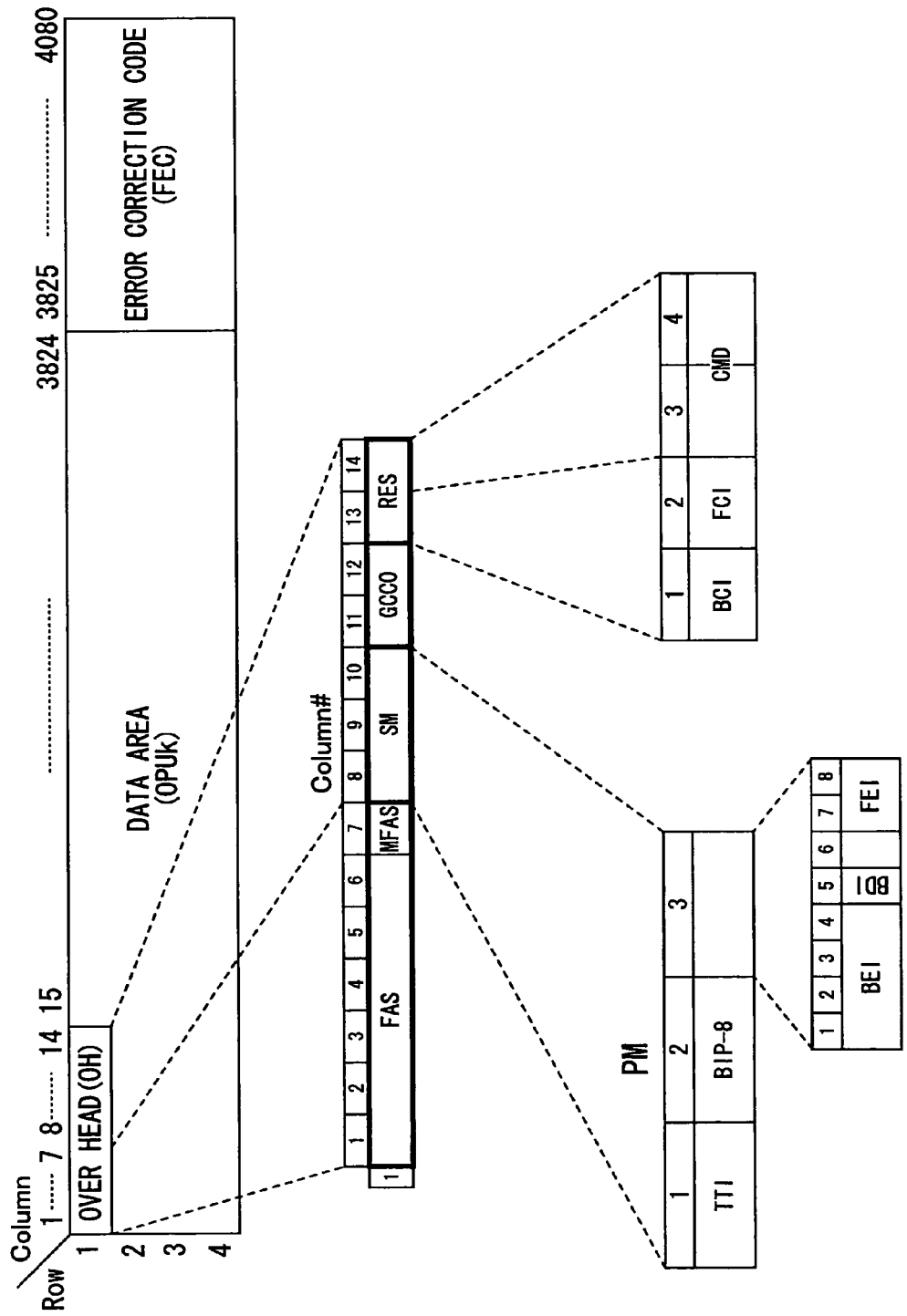
FIG. 3 is a view showing an example of a frame format of a transmission signal.

FIG. 3 is a view showing an example of a frame format of a transmission signal. This shows the frame structure of a digital wrapper recommended by ITU-T G709. The transmission signal has a 4080×4 byte structure. This frame structure includes the overhead OH of 56 (=14×4) bytes, a data area OPUk of 15296 (=3824×4) bytes, and an error correction code FEC (Forward Error Correction) of 1024 byte.

An error detection code BIP 8 (Bit Interleaved Parity-level 8) is stored in the ninth column of the first line of the overhead. Backward error information BEI (Backward Error Indication) and forward error information (Forward Error Indication) are stored in the tenth column.

Backward correction information BCI (Backward Correction Indication) and forward correction information FCI (Forward Correction Information) are stored in the thirteenth column. Control information CMD is stored in the fourteenth column.

Figure 4:
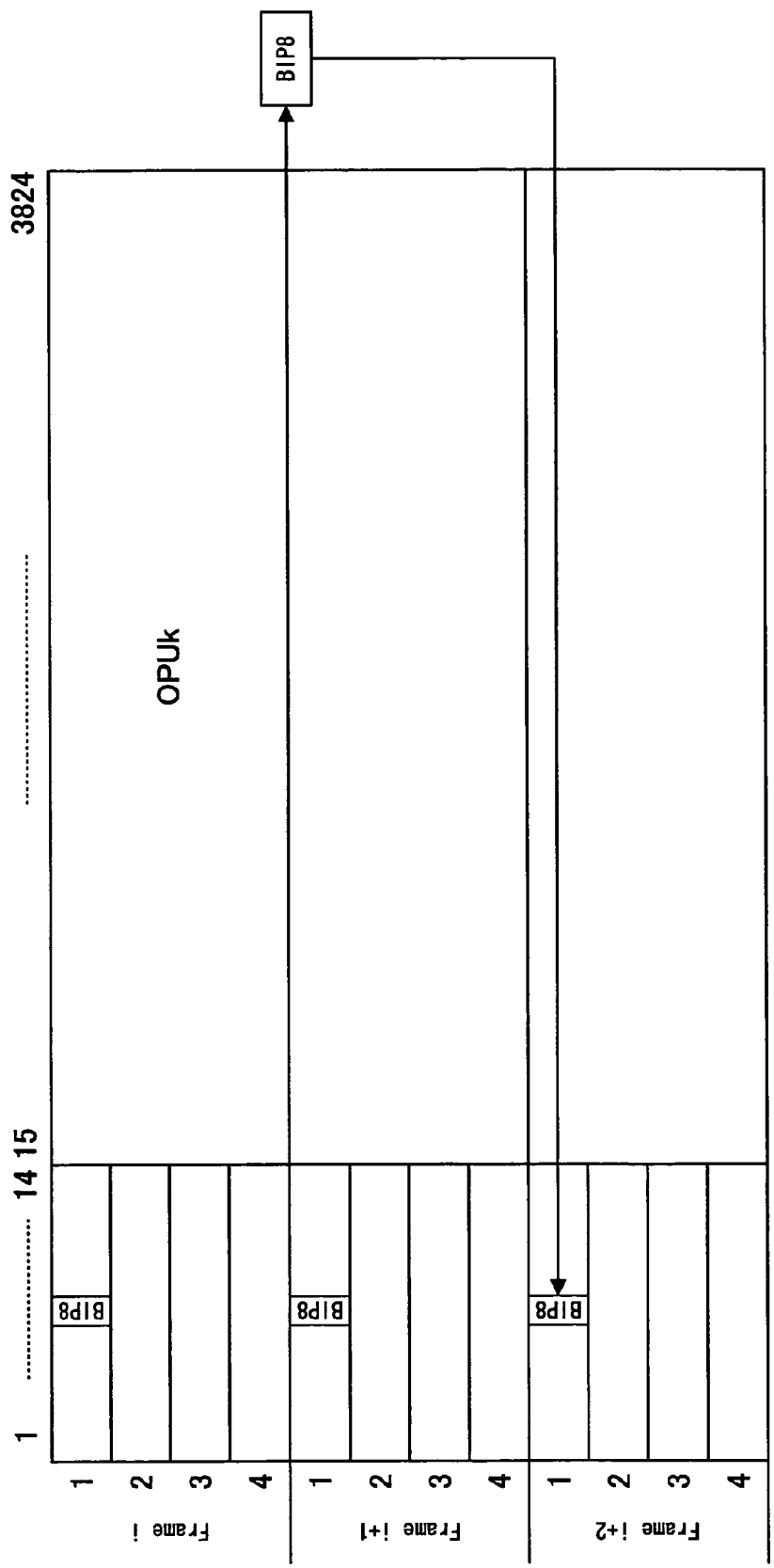
FIG. 4 is a view for explaining generation and storage of an error detecting code BIP8.

As shown in FIG. 4, the error detection code BIP 8 stores a parity value calculated from a data area (OPUk) of a frame i in the overhead of a frame i+2 which is two frames after the frame i. In addition, an error correction code (FEC) is, for example, a BCH (Bose Chaudhuri Hocquengham) code or a Reed Solomon code calculated from data of a data area OPUk of the frame i, and is stored in the frame i.

In an OH receiving part 45 of the regenerative relay apparatus 44 shown in FIG. 2, the overhead of a receiving frame is terminated, and error detection is done by using the error detection code BIP 8 in the overhead and data of the data area OPUk of the frame preceding by two frames so as to be supplied to an error count part 46. Furthermore, data in the data area OPUk and the error correction code FEC are supplied to a decoding part 47 and a selection part 49.

The decoding part 47 decodes data by implementing the error correction of the data of the data area OPUk by using the error correction code FEC and implements timing regeneration, waveform shaping, and others. The data (corresponding to the data area OPUk) for which the error correction is implemented are encoded again by the encoding part 48 so that the error correction code FEC is generated, and are then supplied to the selection part 49.

The error count part 46 calculates an error rate of a transmission path between the terminal apparatus 40 and the regenerative relay apparatus 44 from an error detection result supplied from the OH receiving part 45 and supplies the error rate to an adder 51. The OH receiving part 52 terminates the overhead of the receiving frame of a going-down (downstream) circuit so as to take out the backward error information BEI in the overhead. The backward error information BEI is an error rate between the regenerative relay apparatus 44 and the terminal apparatus 54 and supplied to the adder 51.

The adder 51 supplies the total of an error rate of the transmission path between the terminal apparatus 40 and the regenerative relay apparatus 44 and the error rate of the transmission path between the regenerative relay apparatus 44 and the terminal apparatus 54 to a threshold determination part 53.

The threshold determination part 53 compares an error correction threshold determined by an error correction ability set in advance at the decoding part 57 of the terminal apparatus 54 and the total error rate supplied from the adder 51. In a case where the total error rate does not exceed the threshold, a signal route is selected by the selection part 49 so that the signal goes to the selection part 49 without going through the decoding part 47 and the encoding part 48. On the other hand, in a case where the total error rate exceeds the threshold, a signal route is selected by the selection part 49 so that the signal goes to the selection part 49 via the decoding part 47 and the encoding part 48.

The overhead is added to the error correction code FEC and the data in the data area OPUk being output by the selection part 49 by an OH transmission part 50. Then, the data in the data area OPUk and the error correction code FEC are transmitted to the terminal apparatus 54 by the going-up (upstream) circuit.

The overhead of the receiving frame is terminated at the OH receiving part 55 of the terminal apparatus 54. Error detection is done by using the error detection code BIP 8 in the overhead and data of the data area OPUk of the frame preceding by two frames so as to be supplied to an error count part 56. Furthermore, data in the data area OPUk and the error correction code FEC are supplied to a decoding part 57.

The decoding part 57 decodes data by implementing the error correction of the data of the data area OPUk by using the error correction code FEC and implements timing regeneration, waveform shaping, and others.

The error count part 56 calculates an error rate of a transmission path between the terminal apparatus 50 and the regenerative relay apparatus 44 from an error detection result supplied from the OH receiving part 55 and supplies the error rate to an OH transmission part 58. The OH transmission part 58 stores the error rate supplied from the error count part 56 in the backward error information BEI in the overhead of the transmission frame of the going-down (downstream) circuit and transmits the error rate to the regenerative relay apparatus 44 via a going-down (downstream) circuit.

Thus, by the threshold determination part 53, the total of the error rate of the transmission path between the terminal apparatus 40 and the regenerative relay apparatus 44 and the error rate of the transmission path between the regenerative relay apparatus 44 and the terminal apparatus 54 is compared with error correction threshold determined by the error correction ability set in advance at the decoding part 57. In the case where the total error rate does not exceed the error correction threshold, the signal route is selected by the selection part 49 so that the signal goes to the selection part 49 without going through the decoding part 47 and the encoding part 48. As a result of this, the error in a transmission section from the terminal apparatus 40 and the terminal apparatus 54 is corrected by the error correction function of the terminal apparatuses 40 and 54 so that the signal does not go through the decoding part 47 and the coding part 48 of the regenerative relay apparatus 44. Hence, it is possible to minimize the signal delay.

In the above-discussed first embodiment, the regenerative relay apparatus 44 is connected to the terminal apparatuses 40 and 54. However, the regenerative relay apparatus 44 may be connected to another regenerative relay apparatus, instead of the terminal apparatuses 40 and 54.

Second Embodiment of the Present Invention

Figure 5:
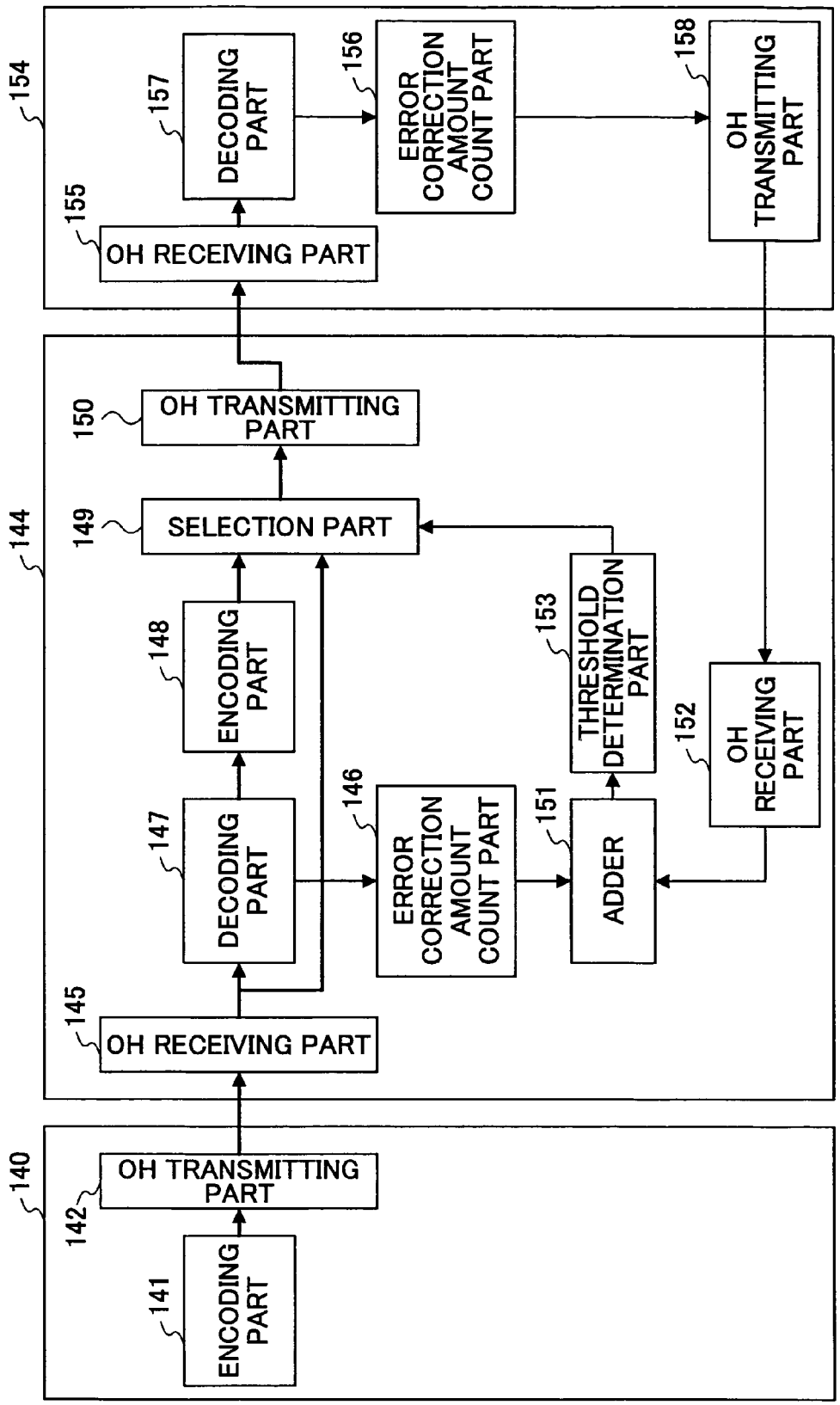
FIG. 5 is a structural view of a second embodiment of the relay method of the present invention.

FIG. 5 is a structural view of a second embodiment of the relay method of the present invention. Referring to FIG. 5, an error correction code that is a redundancy bit for error correction is added to a signal in an encoding part 141 of a terminal apparatus 140. Overhead is added to the signal by an OH transmission part 142 so as to be transmitted to a regenerative relay apparatus 144 via a going-up (upstream) circuit.

In an OH receiving part 145 of the regenerative relay apparatus 144, the overhead of a receiving frame is terminated. Furthermore, data in the data area OPUk among the transmission signals of the frame format shown in FIG. 3 and the error correction code FEC are supplied to a decoding part 147 and a selection part 149.

The decoding part 147 decodes data by implementing the error correction of the data of the data area OPUk by using the error correction code FEC and implements timing regeneration, waveform shaping, and others. At this time, an error corrected part is supplied to an error correction amount count part 146. The data (corresponding to the data area OPUk) for which the error correction is implemented are encoded again by the encoding part 148 so that the error correction code AFEC is generated, and are then supplied to the selection part 149.

The error count part 146 calculates the number of bits of the error corrected part supplied from the decoding part 147 and supplies the number of error correction bit generated at the transmission path between the terminal apparatus 140 and the regenerative relay apparatus 144 to an adder 151. The OH receiving part 152 terminates the overhead of the receiving frame of a going-down (downstream) circuit so as to take out the backward error information BCI in the overhead. The backward error information BCI is an error rate between the regenerative relay apparatus 144 and the terminal apparatus 154 and supplied to the adder 151.

The adder 151 supplies the total of the number of error correction bits of the transmission path between the terminal apparatus 140 and the regenerative relay apparatus 144 and the number of error correction bits of the transmission path between the regenerative relay apparatus 144 and the terminal apparatus 154 to a threshold determination part 153.

The threshold determination part 153 compares an error correction threshold determined by an error correction ability set in advance at the decoding part 157 of the terminal apparatus 154 and the total number of the error correction bits supplied from the adder 151. In a case where the total error rate does not exceed the threshold, a signal route is selected by the selection part 49 so that the signal goes to the selection part 149 without going through the decoding part 147 and the encoding part 148. On the other hand, in a case where the total error rate exceeds the threshold, a signal route is selected by the selection part 149 so that the signal goes to the selection part 149 via the decoding part 147 and the encoding part 148.

The overhead is added to the error correction code FEC and the data in the data area OPUk being output by the selection part 149 by an OH transmission part 150. Then, the data in the data area OPUk and the error correction code FEC are transmitted to the terminal apparatus 154 by the going-up (upstream) circuit.

The overhead of the receiving frame is terminated at the OH receiving part 155 of the terminal apparatus 154. Data in the data area OPUk and the error correction code FEC among transmission signals of the frame format shown in FIG. 3 are supplied to a decoding part 157.

The decoding part 157 decodes data by implementing the error correction of the data of the data area OPUk by using the error correction code FEC and implements timing regeneration, waveform shaping, and others. At this time, the error corrected part is supplied to an error correction amount count part 156.

The error count part 156 calculates the number of the bits of the error corrected part supplied from the decoding part 157 and supplies the number of the error correction bits generated at the transmission path between the regenerative relay apparatus 144 and the terminal apparatus 154 to an OH transmission part 158. The OH transmission part 158 stores the number of the error correction bits supplied from the error correction amount count part 156 in the backward error information BCI in the overhead of the transmission frame of the going-down (downstream) circuit and transmits the number of the bits to the terminal apparatus regenerative relay apparatus 144 via a going-down (downstream) circuit.

Thus, by the threshold determination part 153, the total of the error correction amount of the transmission path between the terminal apparatus 140 and the regenerative relay apparatus 144 and the error correction amount of the transmission path between the regenerative relay apparatus 144 and the terminal apparatus 154 is compared with the error correction threshold determined by the error correction ability set in advance at the decoding part 157. In the case where the total error correction amount does not exceed the error correction threshold, the signal route is selected by the selection part 149 so that the signal goes to the selection part 149 without going through the decoding part 147 and the encoding part 148. As a result of this, the error in a transmission section from the terminal apparatus 140 and the terminal apparatus 154 is corrected by the error correction function of the terminal apparatuses 140 and 154 so that the signal does not go through the decoding part 147 and the encoding part 148 of the regenerative relay apparatus 144. Hence, it is possible to minimize the signal delay.

In the above-discussed second embodiment, the regenerative relay apparatus 144 is connected to the terminal apparatuses 140 and 154. However, the regenerative relay apparatus 144 may be connected to another regenerative relay apparatus, instead of the terminal apparatuses 140 and 154.

Third Embodiment

Figure 6:
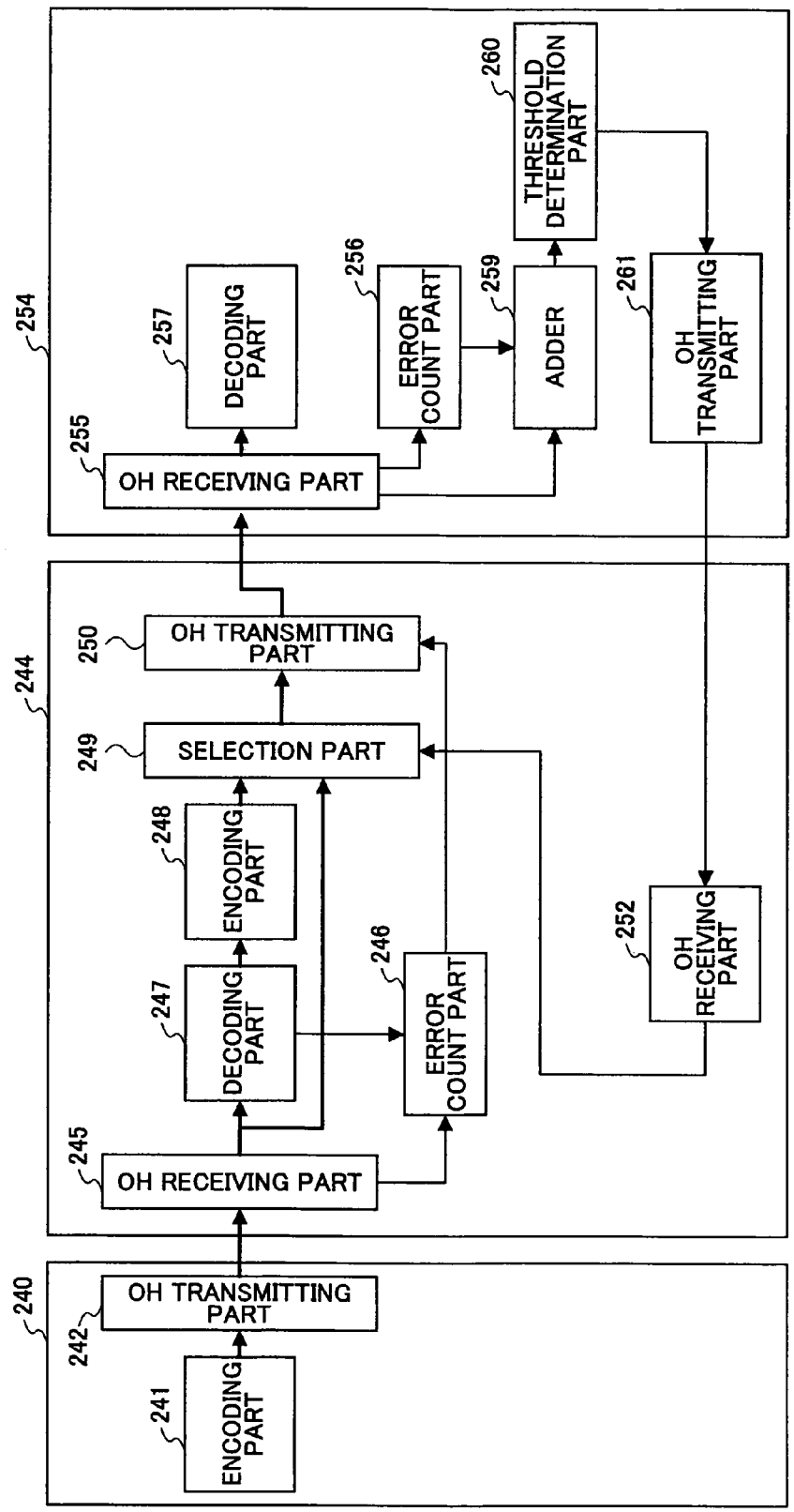
FIG. 6 is a structural view of a third embodiment of the relay method of the present invention.

FIG. 6 is a structural view of a third embodiment of the relay method of the present invention. The difference between the first embodiment and the third embodiment is that, in the third embodiment, a threshold determination part is provided at a latter part terminal apparatus and a result of determination by the threshold determination part goes back to the regenerative relay apparatus so that control of the selection part is implemented.

Referring to FIG. 6, an error correction code that is a redundancy bit for error correction is added to a signal in an encoding part 241 of a terminal apparatus 240. Overhead is added to the signal by an OH transmission part 242 so as to be transmitted to a regenerative relay apparatus 244 via a going-up (upstream) circuit.

In an OH receiving part 245 of the regenerative relay apparatus 244, the overhead of a receiving frame shown in FIG. 3 is terminated, and error detection is done by using the error detection code BIP 8 in the overhead and data of the data area OPUk of the frame preceding by two frames so as to be supplied to an error count part 246. Furthermore, data in the data area OPUk and the error correction code FEC are supplied to a decoding part 247 and a selection part 249.

The decoding part 247 decodes data by implementing the error correction of the data of the data area OPUk by using the error correction code FEC and implements timing regeneration, waveform shaping, and others. The data (corresponding to the data area OPUk) for which the error correction is implemented are encoded again by the encoding part 248 so that the error correction code FEC is generated, and are then supplied to the selection part 249.

The error count part 246 calculates an error rate of a transmission path between the terminal apparatus 240 and the regenerative relay apparatus 244 from an error detection result supplied from the OH receiving part 245 and supplies the error rate to an OH transmission part 250.

In the OH receiving part 252, the overhead of the receiving frame of the going-down (downstream) circuit is terminated and control information CMD in the overhead is taken out. The control information CMD is an order for making the selection part 249 select a signal route without going through the decoding part 247 and a encoding part 248 or a signal route going through the decoding part 247 and the encoding part 248. The selection part 249 follows this order so as to select either one of the signal routes and supplies the signal to the OH receiving part 250.

The data in the data area OPUk output from the selection part 249 and the error correction code FEC are supplied to the OH receiving part 250. In the OH receiving part 250, the error rate supplied from the error count part 246 is stored in forward error information FEI in the overhead so that the going-up (upstream) circuit is transmitted to the terminal apparatus 254.

In an OH receiving part 255 of the regenerative relay apparatus 254, the overhead of a receiving frame is terminated, and error detection is done by using the error detection code BIP 8 in the overhead and data of the data area OPUk of the frame preceding by two frames so as to be supplied to an error count part 256. In addition, data in the data area OPUk and the error correction code FEC are supplied to a decoding part 257. Furthermore, forward error information FEI (an error rate of the transmission path between the terminal apparatus 240 and the regenerative relay apparatus 244) in the overhead is taken out and supplied to an adder 259.

The decoding part 257 decodes data by implementing the error correction of the data of the data area OPUk by using the error correction code FEC and implements timing regeneration, waveform shaping, and others.

The error count part 256 calculates the error rate of a transmission path between the terminal apparatus 254 and the regenerative relay apparatus 244 from the error detection result supplied from the OH receiving part 255 and supplies the error rate to an adder 259.

The adder 259 supplies the total of an error rate of the transmission path between the terminal apparatus 240 and the regenerative relay apparatus 244 and an error rate of the transmission path between the terminal apparatus 254 and the regenerative relay apparatus 244, to the threshold determination part 260.

The threshold determination part 260 compares an error correction threshold determined by an error correction ability set in advance at the decoding part 257 of the terminal apparatus 254 and the total error rate supplied from the adder 259. In a case where the total error rate does not exceed the threshold, a signal route is selected by the selection part 249 so that the signal goes to the selection part 249 without going through the decoding part 247 and the encoding part 248. On the other hand, in a case where the total error rate exceeds the threshold, an order is supplied to the OH receiving part 261, so that a signal route is selected by the selection part 249 and thereby the signal goes to the selection part 249 via the decoding part 247 and the encoding part 248.

The OH transmission part 261 stores the order supplied from the threshold determination part 260 in the control information CMD in the overhead of the transmission frame of the going-down (downstream) circuit and transmits the order to the regenerative relay apparatus 44 via a going-down (downstream) circuit.

Thus, in a case where the total of the error rate of the transmission path between the terminal apparatus 240 and the regenerative relay apparatus 244 and the error rate of the transmission path between the regenerative relay apparatus 244 and the terminal apparatus 254 does not exceed the error correction threshold, the signal route is selected by the selection part 249 so that the signal goes to the selection part 249 without going through the decoding part 247 and the encoding part 248. As a result of this, the error in a transmission section from the terminal apparatus 240 to the terminal apparatus 254 is corrected by the error correction function of the terminal apparatuses 240 and 254 so that the signal does not go through the decoding part 247 and the coding part 248 of the regenerative relay apparatus 244. Hence, it is possible to minimize the signal delay.

In the above-discussed third embodiment, the regenerative relay apparatus 244 is connected to the terminal apparatuses 240 and 254. However, the regenerative relay apparatus 244 may be connected to another regenerative relay apparatus, instead of the terminal apparatuses 240 and 254.

Fourth Embodiment

Figure 7:
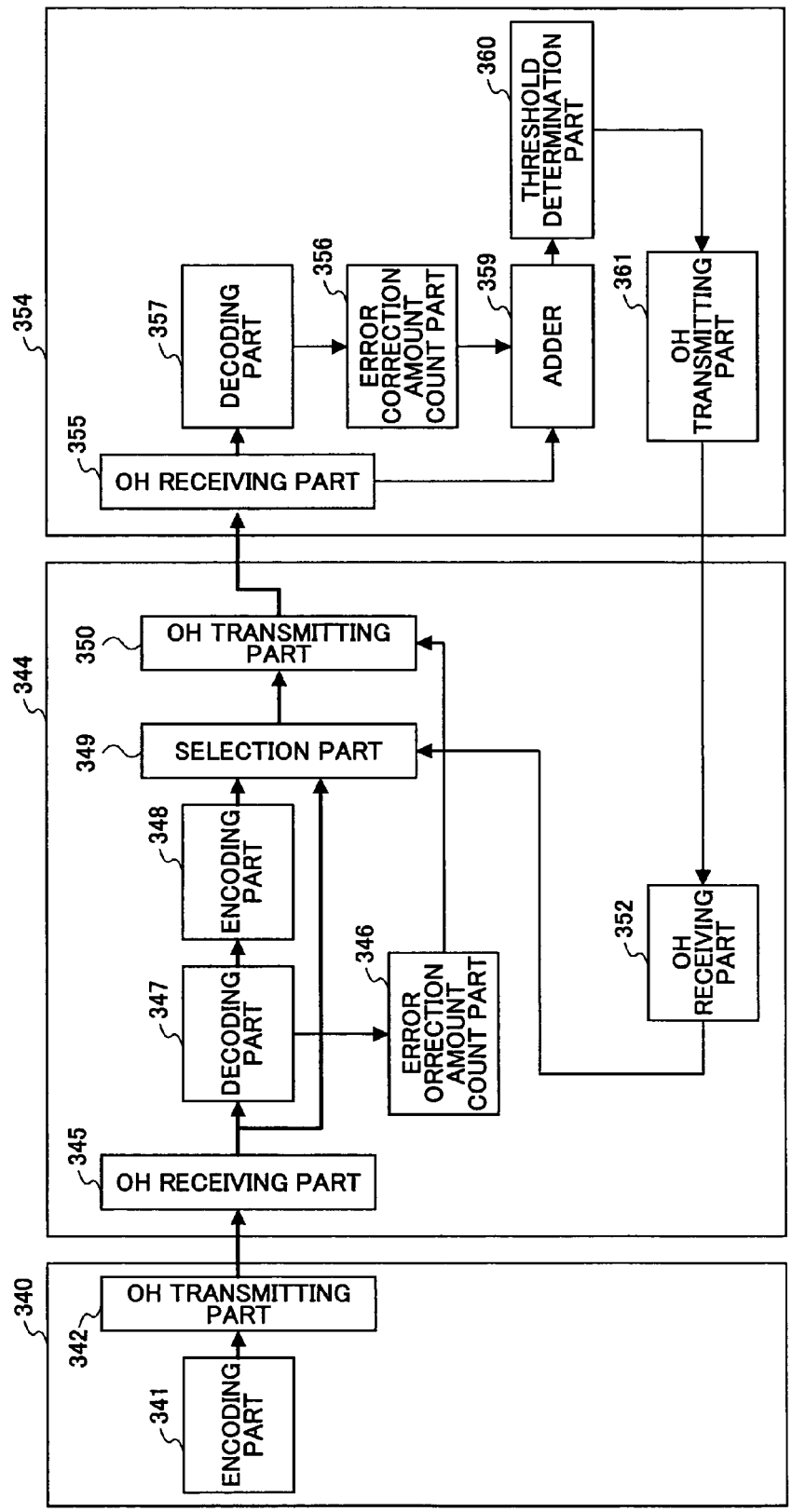
FIG. 7 is a structural view of a fourth embodiment of the relay method of the present invention.

FIG. 7 is a structural view of a fourth embodiment of the relay method of the present invention. The difference between the second embodiment and the fourth embodiment is that, in the fourth embodiment, a threshold determination part is provided in a latter part terminal apparatus and a result of determination by the threshold determination part goes back to the regenerative relay apparatus so that control of the selection part is implemented.

Referring to FIG. 7, an error correction code that is a redundancy bit for error correction is added to a signal in an encoding part 341 of a terminal apparatus 340. Overhead is added to the signal by an OH transmission part 342 so as to be transmitted to a regenerative relay apparatus 344 via a going-up (upstream) circuit.

In an OH receiving part 345 of the regenerative relay apparatus 344, the overhead of a receiving frame is terminated. Furthermore, data in the data area OPUk among the transmission signals of the frame format shown in FIG. 3 and the error correction code FEC are supplied to a decoding part 347 and a selection part 349.

The decoding part 347 decodes data by implementing the error correction of the data of the data area OPUk by using the error correction code FEC and implements timing regeneration, waveform shaping, and others. At this time, an error corrected part is supplied to an error correction amount count part 346. The data (corresponding to the data area OPUk) for which the error correction is implemented is encoded again by the encoding part 348 so that the error correction code FEC is generated, and are then supplied to the selection part 349.

The error count part 346 calculates the number of bits of the error corrected part supplied from the decoding part 347 and supplies the number of error correction bit generated at the transmission path between the terminal apparatus 340 and the regenerative relay apparatus 344 to an OH transmission part 350.

In the OH receiving part 352, the overhead of the receiving frame of the going-down (downstream) circuit is terminated and control information CMD in the overhead is taken out. The control information CMD is an order for making the selection part 349 select a signal route without going through a decoding part 347 and a encoding part 348 and or a signal route going through the decoding part 347 and the encoding part 348. The selection part 349 follows this order so as to select either one of the signal routes and supplies the signal to the OH receiving part 350.

The data in the data area OPUk output from the selection part 349 and the error correction code FEC are supplied to the OH receiving part 350. In the OH receiving part 350, the error correction bit number supplied from the error correction number count part 346 is stored in forward error correction information FEC in the overhead so that the FEC is transmitted to the terminal apparatus 354 via the going-up (upstream) circuit.

The overhead of the receiving frame is terminated at the OH receiving part 355 of the terminal apparatus 354. Data in the data area OPUk and the error correction code FEC among transmission signals of the frame format shown in FIG. 3 are supplied to a decoding part 357. In addition, forward error correction information FCI (the number of correction bits of the transmission path between the terminal apparatus 340 and the regenerative relay apparatus 344) in the overhead is taken out and supplied to an adder 359.

The decoding part 357 decodes data by implementing the error correction of the data of the data area OPUk by using the error correction code FEC and implements timing regeneration, waveform shaping, and others. At this time, the error corrected part is supplied to an error correction amount count part 356.

The error count part 356 calculates the number of the bits of the error corrected part at the transmission path between the regenerative relay apparatus 344 and the terminal apparatus 354 from the error corrected part supplied from the OH receiving part 355 and supplies it to the adder 359.

The adder 359 supplies the total of the number of error correction bits generated at the transmission path between the terminal apparatus 340 and the regenerative relay apparatus 344 and the number of error correction bits generated at the transmission path between the terminal apparatus 354 and the regenerative relay apparatus 344, to the threshold determination part 360.

The threshold determination part 360 compares an error correction threshold determined by an error correction ability set in advance at the decoding part 357 of the terminal apparatus 354 and the total error rate supplied from the adder 359. In a case where the total error rate does not exceed the threshold, a signal route is selected by the selection part 349 so that the signal goes to the selection part 349 without going through the decoding part 347 and the encoding part 348. On the other hand, in a case where the total error rate exceeds the threshold, an order is supplied to the OH receiving part 361, so that a signal route is selected by the selection part 349 and thereby the signal goes to the selection part 349 via the decoding part 347 and the encoding part 348.

The OH transmission part 361 stores the order supplied from the threshold determination part 360 in the control information CMD in the overhead of the transmission frame of the going-down (downstream) circuit and transmits the order to a terminal apparatus regenerative relay apparatus 344 via a going-down (downstream) circuit.

Thus, in a case where the total of the error correction amount of the transmission path between the terminal apparatus 340 and the regenerative relay apparatus 344 and the error correction amount of the transmission path between the regenerative relay apparatus 344 and the terminal apparatus 354 does not exceed the error correction threshold, the signal route is selected by the selection part 349 so that the signal goes to the selection part 349 without going through the decoding part 347 and the encoding part 348. As a result of this, the error in a transmission section from the terminal apparatus 340 and the terminal apparatus 354 is corrected by the error correction function of the terminal apparatuses 340 and 354 so that the signal does not go through the decoding part 347 and the coding part 348 of the regenerative relay apparatus 344. Hence, it is possible to minimize the signal delay.

In the above-discussed first embodiment, the regenerative relay apparatus 344 is connected to the terminal apparatuses 340 and 354. However, the regenerative relay apparatus 344 may be connected to another regenerative relay apparatus, instead of the terminal apparatuses 340 and 354.

Fifth Embodiment

Figure 8:
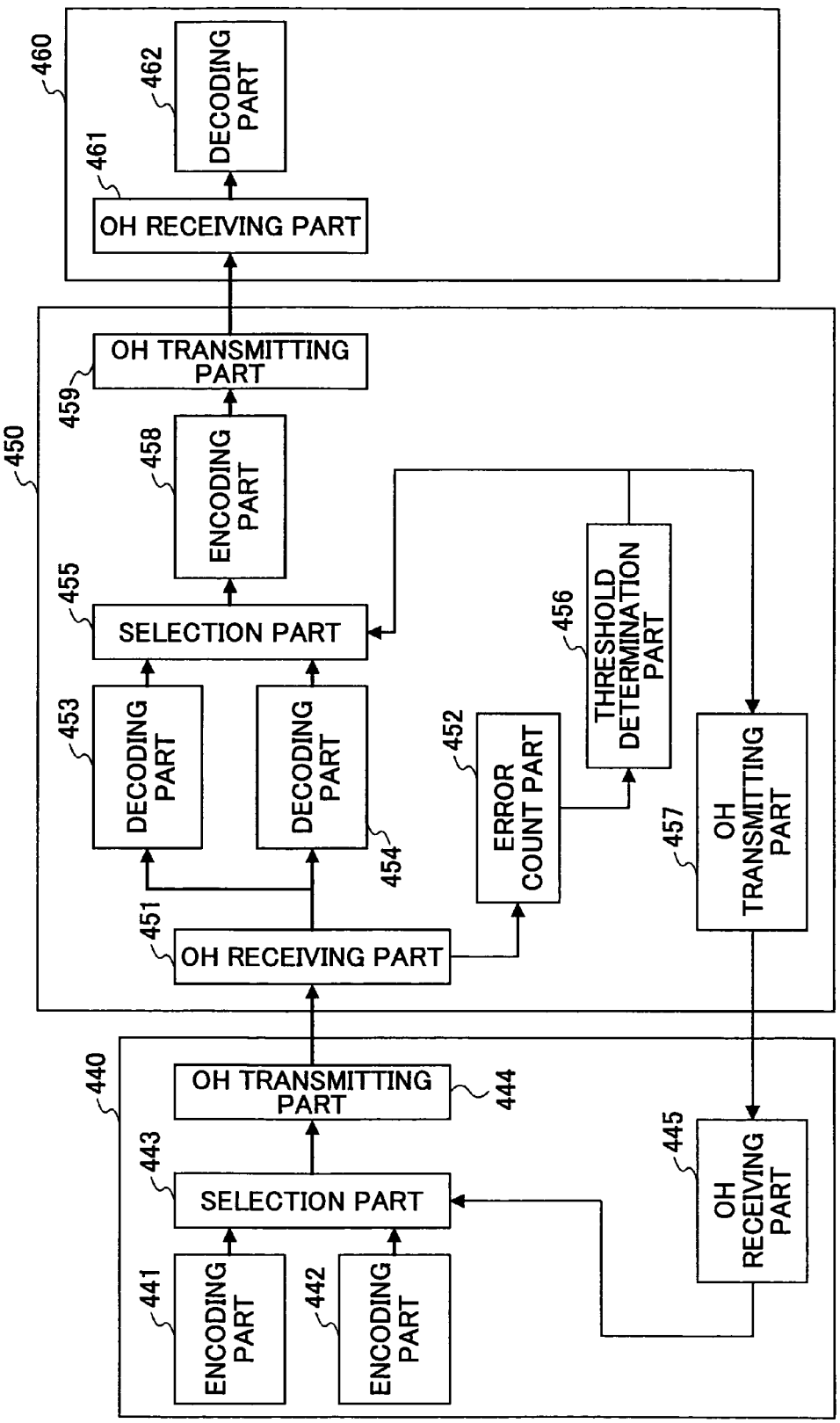
FIG. 8 is a structural view of a fifth embodiment of the relay method of the present invention.

FIG. 8 is a structural view of a fifth embodiment of the relay method of the present invention. Referring to FIG. 8, an error correction code that is a redundancy bit for error correction is added to signals in encoding parts 441 and 442 of a terminal apparatus 440. Either one of the signals is selected by a selection part 443 and overhead is added to the selected signal by an OH transmission part 444 so as to be transmitted to a regenerative relay apparatus 450 via a going-up (upstream) circuit.

Here, the encoding parts 441 and 442 implement encoding wherein each has an error correction ability that is different such that a redundancy bit rate is 3% or 7% (or, 12% or 25%). The error correction ability of the encoding part 442 is greater than the error correction ability of the encoding part 441. A delay time at the time of decoding in the encoding part 442 is greater than a delay time at the time of decoding in the encoding part 441. In the encoding parts 441 and 442, encoding with different methods such as a Reed Solomon code or a BHC code may be implemented.

In the OH receiving part 445, the overhead of the receiving frame of the going-down (downstream) circuit is terminated and control information CMD in the overhead is taken out. The control information CMD is an order for the selection part 443 to select the encoding part 441 or 442. The selection part 443 follows this order so as to select either one of the output signal and supplies the selected signal to the OH transmission part 444.

In an OH receiving part 445 of the regenerative relay apparatus 450, the overhead of a receiving frame shown in FIG. 3 is terminated, and error detection is done by using the error detection code BIP 8 in the overhead and data of the data area OPUk of the frame preceding by two frames so as to be supplied to an error count part 452. Furthermore, data in the data area OPUk and the error correction code FEC are supplied to decoding parts 453 and 454.

The decoding parts 453 and 454 implement decoding corresponding to the encoding parts 441 and 442. The decoding parts 453 and 454 decode data by implementing the error correction of the data of the data area OPUk by using the error correction code FEC and implement timing regeneration, waveform shaping, and others.

The data (corresponding to the data area OPUk) for which the error correction is implemented in the decoding parts 453 and 454 are supplied to the selection part 455. Either one of the data sets is selected and encoded again by the encoding part 458 so that the error correction code FEC is generated, the overhead is added by the OH transmission part 459, and the frame is transmitted to the terminal apparatus 460.

The error count part 452 calculates an error rate of a transmission path between the terminal apparatus 440 and the regenerative relay apparatus 450 from an error detection result supplied from the OH receiving part 451 and supplies the error rate to a threshold determination part 456.

The threshold determination part 456 compares an error correction threshold determined by an error correction ability set in advance at the decoding part 453 and the error of the error count part 452. In a case where the error rate does not exceed the threshold, the decoding part 453 is selected. In a case where the error rate exceeds the threshold, an order is supplied to the selection part 455 and the OH transmission part 457, so that the decoding part 454 is selected.

The OH transmission part 457 stores the order supplied from the threshold determination part 456 in the control information CMD in the overhead of the transmission frame of the going-down (downstream) circuit and transmits the order to the terminal apparatus 440 via a going-down (downstream) circuit.

The overhead of the receiving frame is terminated in the OH receiving part 461 of the terminal apparatus 460 and the data in the data area OPUk and the error correction code FEC are supplied to the decoding part 462. The decoding part 462 decodes the data by implementing the error correction of the data of the data area OPUk by using the error correction code FEC and implement timing regeneration, waveform shaping, and others again. Thus, in a case where the error rate of the transmission path between the terminal apparatus 440 and the regenerative relay apparatus 450 does not exceed the error correction threshold, the decoding part 453 and the encoding part 441 whose delay time is small are selected by the selecting parts 443 and 455. In a case where error rate of the transmission path between the terminal apparatus 440 and the regenerative relay apparatus 450 exceeds the error correction threshold, the decoding part 454 and the encoding part 442 whose delay time is greater are selected so that it is possible to minimize the signal delay.

In the above-discussed embodiment, the regenerative relay apparatus 450 is connected to the terminal apparatuses 440 and 460. However, the regenerative relay apparatus 450 may be connected to another regenerative relay apparatus, instead of the terminal apparatuses 440 and 460.

Sixth Embodiment

Figure 9:
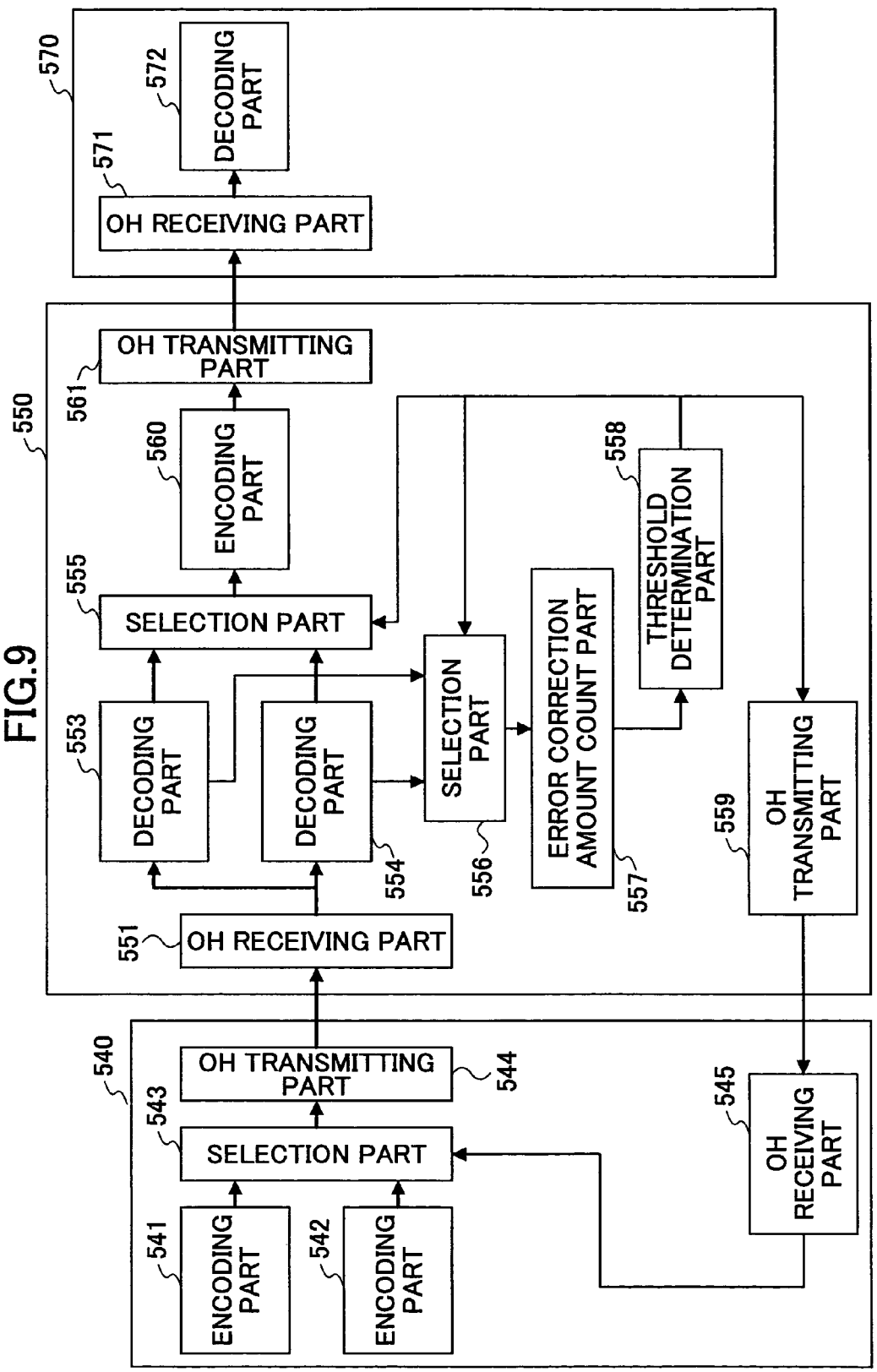
FIG. 9 is a structural view of a sixth embodiment of the relay method of the present invention.

FIG. 9 is a structural view of a sixth embodiment of the relay method of the present invention. Referring to FIG. 9, an error correction code that is a redundancy bit for error correction is added to signals in encoding parts 541 and 542 of a terminal apparatus 540. Either one of the signals is selected by a selection part 543 and overhead is added to the selected signal by an OH transmission part 544 so as to be transmitted to a regenerative relay apparatus 550 via a going-up (upstream) circuit.

Here, the encoding parts 541 and 542 implement encoding wherein each has an error correction ability that is different such that a redundancy bit rate is 3% or 7% (or, 12% or 25%). The error correction ability of the encoding part 542 is greater than the error correction ability of the encoding part 541. A delay time at the time of decoding in the encoding part 542 is greater than a delay time at the time of decoding in the encoding part 541. In the encoding parts 541 and 542, encoding with different methods such as a Reed Solomon code or a BHC code may be implemented.

In the OH receiving part 545, the overhead of the receiving frame of the going-down (downstream) circuit is terminated and control information CMD in the overhead is taken out. The control information CMD is an order for the selection part 543 to select the encoding part 541 or 542. The selection part 543 follows this order so as to select either one of the output signal and supplies the selected signal to the OH transmission part 544.

In an OH receiving part 545 of the regenerative relay apparatus 550, the overhead of a receiving frame shown in FIG. 3 is terminated, and data in the data area OPUk and the error correction code FEC are supplied to decoding parts 553 and 554.

The decoding parts 553 and 554 implements decoding corresponding to the encoding parts 541 and 542. The decoding parts 553 and 554 decode data by implementing the error correction of the data of the data area OPUk by using the error correction code FEC and implement timing regeneration, waveform shaping, and others. The error corrected parts of the decoding parts 553 and 554 are supplied to the selection part 556. Either one of the error corrected parts is selected and supplied to the error correction amount count part 557.

The data (corresponding to the data area OPUk) for which the error correction is implemented in the decoding parts 553 and 554 are supplied to the selection part 555. Either one of the data sets is selected and encoded again by the encoding part 560 so that the error correction code FEC is generated, the overhead is added by the OH transmission part 561, and the frame is transmitted to the terminal apparatus 570.

The error correction amount count part 557 calculates the number of bits of the error corrected part supplied from the selection part 556, and supplies the number of error correction bits generated at the transmission path between the terminal apparatus 540 and the regenerative relay apparatus 550 to a threshold determination part 558.

The threshold determination part 558 compares an error correction threshold determined by an error correction ability set in advance at the decoding part 553 and the error of the error correction amount count part 557. In a case where the error rate does not exceed the threshold, the decoding part 553 is selected. In a case where the error rate exceeds the threshold, an order is supplied to the selection parts 555 and 556 and the OH transmission part 559, so that the decoding part 554 is selected.

The OH transmission part 559 stores the order supplied from the threshold determination part 558 in the control information CMD in the overhead of the transmission frame of the going-down (downstream) circuit and transmits the order to the terminal apparatus 540 via a going-down (downstream) circuit.

The overhead of the receiving frame is terminated in the OH receiving part 571 of the terminal apparatus 570 and the data in the data area OPUk and the error correction code FEC are supplied to the decoding part 572. The decoding part 572 decodes data by implementing the error correction of the data of the data area OPUk by using the error correction code FEC and implements timing regeneration, waveform shaping, and others again.

Thus, in a case where the error rate of the transmission path between the terminal apparatus 540 and the regenerative relay apparatus 550 does not exceed the error correction threshold, the decoding part 553 and the encoding part 541 whose delay time is small are selected by the selecting parts 543, 555 and 556. In a case where error rate of the transmission path between the terminal apparatus 540 and the regenerative relay apparatus 550 exceeds the error correction threshold, the decoding part 554 and the encoding part 542 whose delay time is greater are selected so that it is possible to minimize the signal delay.

In the above-discussed embodiment, the regenerative relay apparatus 550 is connected to the terminal apparatuses 540 and 570. However, the regenerative relay apparatus 550 may be connected to another regeerative relay apparatus, instead of the terminal apparatuses 540 and 570.

Seventh Embodiment

Figure 10:
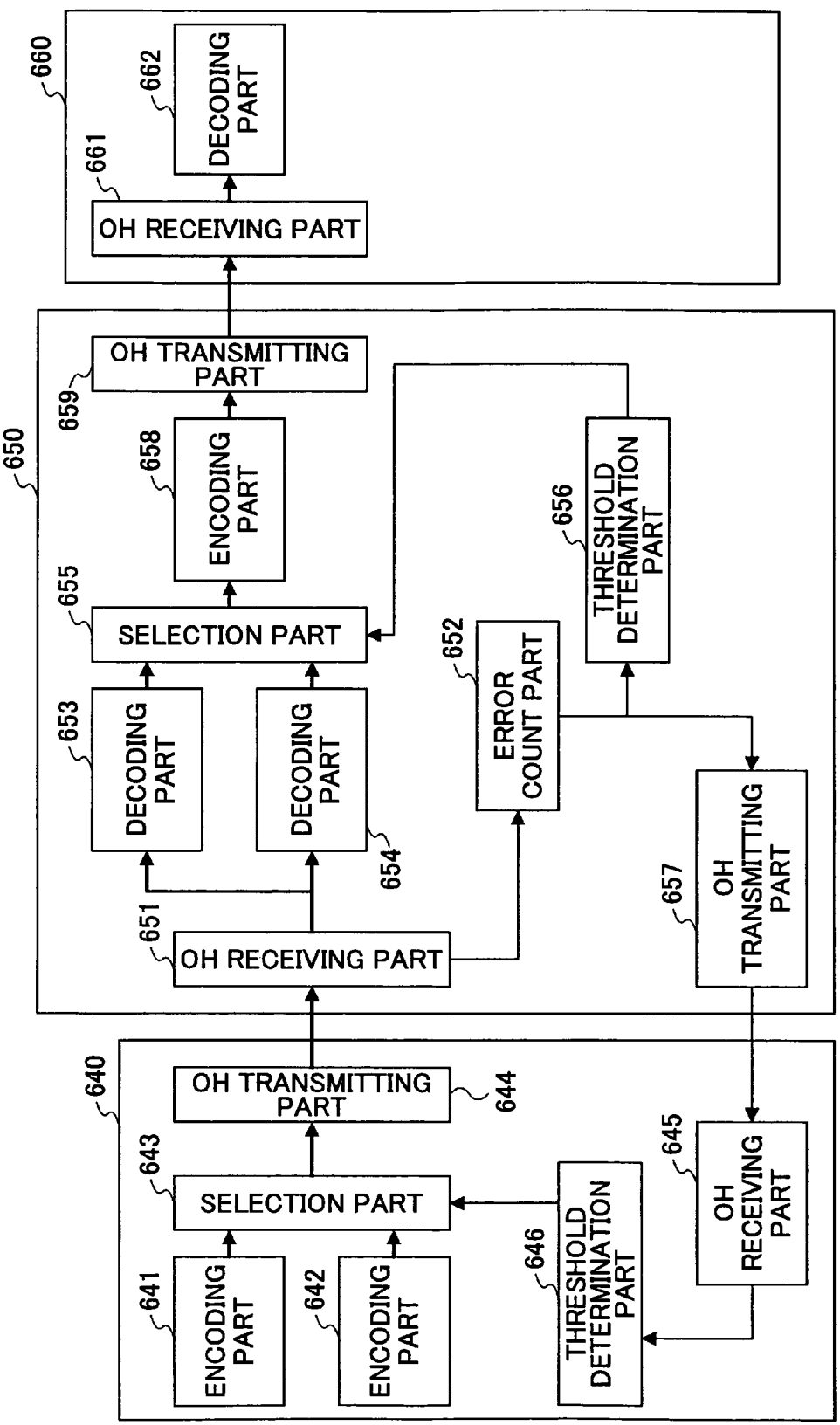
FIG. 10 is a structural view of a seventh embodiment of the relay method of the present invention.

FIG. 10 is a structural view of a seventh embodiment of the relay method of the present invention. The difference between the fifth and seventh embodiments is that, in the seventh embodiment, the threshold determination part is provided in a terminal apparatus, too.

Referring to FIG. 10, an error correction code that is a redundancy bit for error correction is added to signals in encoding parts 641 and 642 of a terminal apparatus 640. Either one of the signals is selected by a selection part 643 and an overhead is added to the selected signal by an OH transmission part 644 so as to be transmitted to a regenerative relay apparatus 650 via a going-up (upstream) circuit.

Here, the encoding parts 641 and 642 implement encoding wherein an error correction capability is different for each such that a redundancy bit rate is 3% or 7% (or, 12% or 25%). The error correction ability of the encoding part 642 is greater than the error correction ability of the encoding part 641. A delay time at the time of decoding in the encoding part 642 is greater than a delay time at the time of decoding in the encoding part 641. In the encoding parts 641 and 642, encoding system whose methods are different such as a Reed Solomon code or a BHC code may be implemented.

The OH receiving part 645 terminates the overhead of the receiving frame of a going-down (downstream) circuit so as to take out the backward error information BEI in the overhead and supply the BEI to the threshold determination part 646. The backward error information BEI is an error rate between the regenerative relay apparatus 650 and the terminal apparatus 640.

The threshold determination part 646 compares an error correction threshold determined by an error correction ability set in advance at the decoding part 653 and the error rate. In a case where the error-rate does not exceed the threshold, the encoding part 641 is selected by the selection part 643. On the other hand, in a case where the error rate exceeds the threshold, the encoding part 642 is selected by the selection part 643.

In an OH receiving part 651 of the regenerative relay apparatus 650, the overhead of a receiving frame shown in FIG. 3 is terminated, and error detection is done by using the error detection code BIP 8 in the overhead and data of the data area OPUk of the frame preceding by two frames so as to be supplied to an error count part 652. Furthermore, data in the data area OPUk and the error correction code FEC are supplied to decoding parts 653 and 654.

The decoding parts 653 and 654 implement decoding corresponding to the encoding parts 651 and 642. The decoding parts 653 and 654 decode data by implementing the error correction of the data of the data area OPUk by using the error correction code FEC and implement timing regeneration, waveform shaping, and others. The data (corresponding to the data area OPUk) for which the error correction is implemented in the decoding parts 653 and 654 are supplied to the selection part 655. Either one of the data sets is selected and encoded again by the encoding part 658 so that the error correction code FEC is generated, the overhead is added by the OH transmission part 659, and the frame is transmitted to the terminal apparatus 660.

The error count part 652 calculates an error rate of a transmission path between the terminal apparatus 640 and the regenerative relay apparatus 650 from an error detection result supplied from the OH receiving part 651 and supplies the error rate to a threshold determination part 656 and the OH receiving part 657.

The threshold determination part 656 compares an error correction threshold determined by an error correction ability set in advance at the decoding part 653 and the error of the error count part 652. In a case where the error rate does not exceed the threshold, the decoding part 653 is selected. In a case where the error rate exceeds the threshold, an order is supplied to the selection part 655, so that the decoding part 654 is selected.

The OH transmission part 657 stores an error rate supplied from the threshold determination part 656 in the backward error information BEI in the overhead of the transmission frame of the going-down (downstream) circuit and transmits the error rate to a terminal apparatus regenerative relay apparatus 640 via a going-down (downstream) circuit.

The overhead of the receiving frame is terminated in the OH receiving part 661 of the terminal apparatus 660 and the data in the data area OPUk and the error correction code FEC are supplied to the decoding part 662. The decoding part 662 decodes data by implementing the error correction of the data of the data area OPUk by using the error correction code FEC and implements timing regeneration, waveform shaping, and others again.

Thus, in a case where the error rate of the transmission path between the terminal apparatus 640 and the regenerative relay apparatus 650 does not exceed the error correction threshold, the decoding part 653 and the encoding part 641 whose delay time is small are selected by the selecting parts 643 and 655. In a case where error rate of the transmission path between the terminal apparatus 640 and the regenerative relay apparatus 650 exceeds the error correction threshold, the decoding part 654 and the encoding part 642 whose delay time is greater are selected so that it is possible to minimize the signal delay.

In the above-discussed embodiment, the regenerative relay apparatus 650 is connected to the terminal apparatuses 640 and 660. However, the regenerative relay apparatus 650 may be connected to another regenerative relay apparatus, instead of the terminal apparatuses 640 and 660.

Eighth Embodiment

Figure 11:
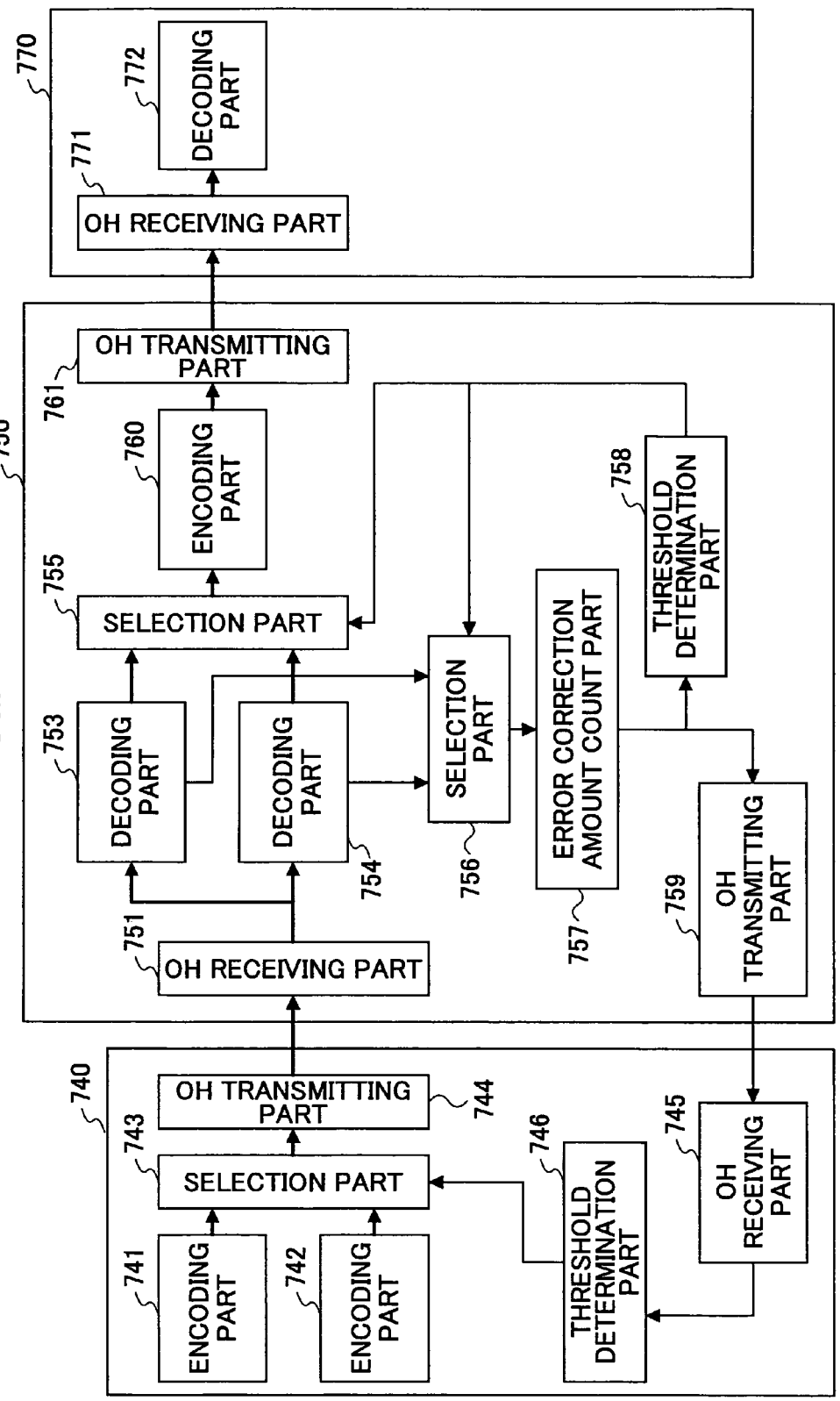
FIG. 11 is a structural view of an eighth embodiment of the relay method of the present invention.

FIG. 11 is a structural view of an eighth embodiment of the relay method of the present invention. The difference between the sixth and eighth embodiments is that, in the eighth embodiment, the threshold determination part is provided in a terminal apparatus, too. Referring to FIG. 11, an error correction code that is a redundancy bit for error correction is added to signals in encoding parts 741 and 742 of a terminal apparatus 740. Either one of the signals is selected by a selection part 743 and overhead is added to the selected signal by an OH transmission part 744 so as to be transmitted to a regenerative relay apparatus 750 via a going-up (upstream) circuit.

Here, the encoding parts 741 and 742 implement encoding wherein an error correction capability is different for each such that a redundancy bit rate is 3% or 7% (or, 12% or 25%). The error correction ability of the encoding part 742 is greater than the error correction ability of the encoding part 741. A delay time at the time of decoding in the encoding part 742 is greater than a delay time at the time of decoding in the encoding part 741. In the encoding parts 741 and 742, encoding system with different methods such as a Reed Solomon code or a BHC code may be implemented.

In the OH receiving part 745, the overhead of the receiving frame of the going-down (downstream) circuit is terminated and the backward error correction information BCI in the overhead is taken out. The backward error correction information BCI is the number of the error correction bits at the transmission path between the regenerative relay apparatus 750 and the terminal apparatus 740. The threshold determination part 746 compares an error correction threshold determined by an error correction ability set in advance at the decoding part 753 and the number of the error correction bits. In a case where the number of the error correction bits does not exceed the threshold, the encoding part 741 is selected by the selection part 743. On the other hand, in a case where the number of the error correction bits exceeds the threshold, the coding part 742 is selected by the selection part 743.

In an OH receiving part 751 of the regenerative relay apparatus 750, the overhead of a receiving frame shown in FIG. 3 is terminated, and data in the data area OPUk and the error correction code FEC are supplied to decoding parts 753 and 754.

The decoding parts 753 and 754 implement decoding corresponding to the encoding parts 741 and 742. The decoding parts 753 and 754 decode data by implementing the error correction of the data of the data area OPUk by using the error correction code FEC and implement timing regeneration, waveform shaping, and others. The error corrected parts of the decoding parts 753 and 754 are supplied to the selection part 756. Either one of the error corrected parts is selected and supplied to the error correction amount count part 757.

The data (corresponding to the data area OPUk) for which the error correction is implemented in the decoding parts 753 and 754 are supplied to the selection part 755. Either one of the data sets is selected and encoded again by the encoding part 760 so that the error correction code FEC is generated, the overhead is added by the OH transmission part 761, and the frame is transmitted to the terminal apparatus 770.

The error correction amount count part 757 calculates the number of bits of the error corrected part supplied from the selection part 756, and supplies the number of error correction bit generated at the transmission path between the terminal apparatus 740 and the regenerative relay apparatus 750 to the threshold determination part 758.

The threshold determination part 758 compares an error correction threshold determined by an error correction capability set in advance at the decoding part 753 and the error of the error correction amount count part 757. In a case where the error rate does not exceed the threshold, the decoding part 753 is selected. In a case where the error rate exceeds the threshold, an order is supplied to the selection parts 755 and 756 and the OH transmission part 759, so that the decoding part 754 is selected.

In the OH transmission part 759, the number of the error correction bits supplied from the error correction amount count part 757 is stored in the backward error correction information BCI in the overhead of the transmission frame of the going-down (downstream) circuit so as to be transmitted to the terminal apparatus 740 via a going-down (downstream) circuit.

The overhead of the receiving frame is terminated in the OH receiving part 771 of the terminal apparatus 770 and the data in the data area OPUk and the error correction code FEC are supplied to the decoding part 772. The decoding part 772 decodes data by implementing the error correction of the data of the data area OPUk by using the error correction code FEC and implements timing regeneration, waveform shaping, and others again.

Thus, in a case where the error rate of the transmission path between the terminal apparatus 740 and the regenerative relay apparatus 750 does not exceed the error correction threshold, the decoding part 753 and the encoding part 741 whose delay time is small are selected by the selecting parts 743, 755 and 756. In a case where error rate of the transmission path between the terminal apparatus 740 and the regenerative relay apparatus 750 exceeds the error correction threshold, the decoding part 754 and the coding part 742 whose delay time is great are selected so that it is possible to minimize the signal delay.

In the above-discussed embodiment, the regenerative relay apparatus 750 is connected to the terminal apparatuses 740 and 770. However, the regenerative relay apparatus 750 may be connected to another regenerative relay apparatus, instead of the terminal apparatuses 740 and 770.

Figure 12:
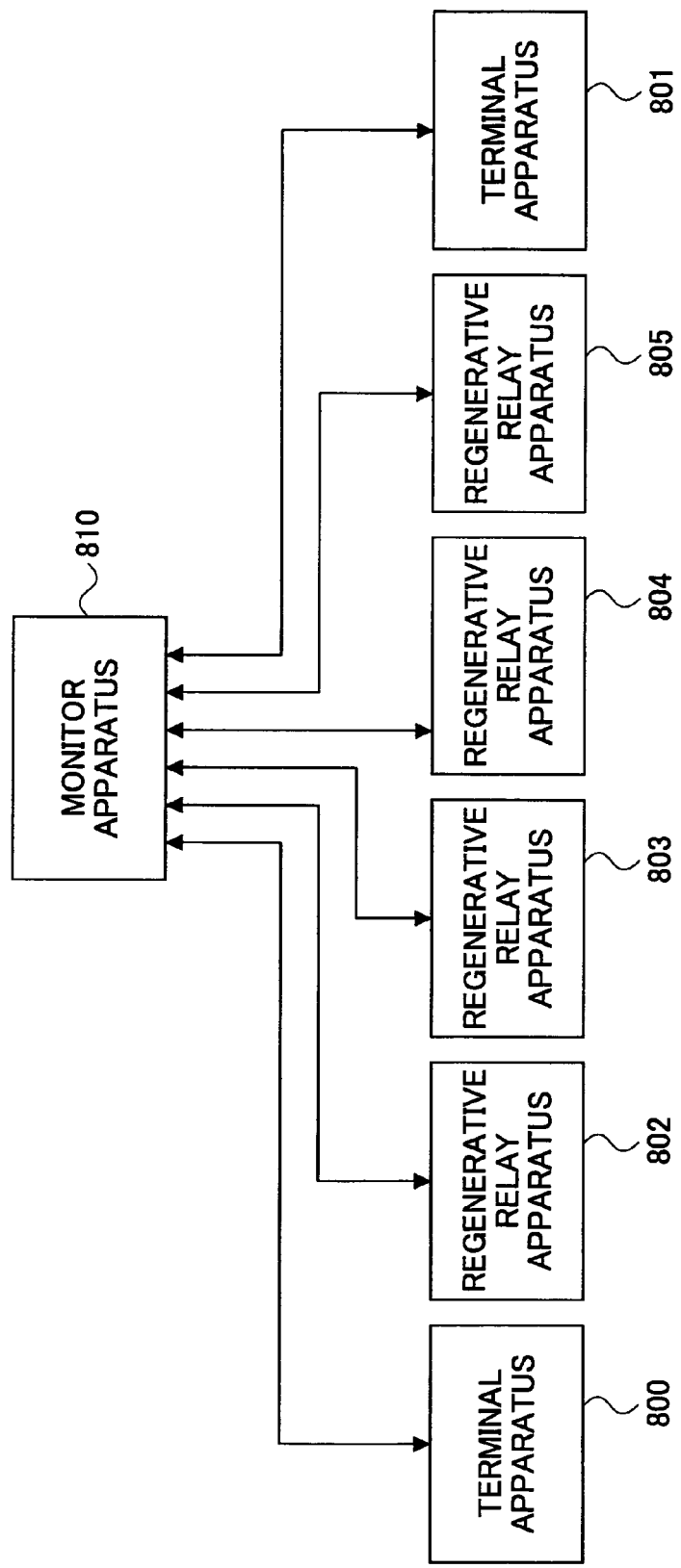
FIG. 12 is a structural view of an example of an optical transmission system.

Here, as shown in FIG. 12, in order to reduce the delay time in the optical transmission system where plural regenerative relay apparatuses 802, 803, 804, and 805 are made in a cascade connection between the terminal apparatuses 800 and 801, it is necessary to not only apply the first through fourth embodiments but also determine which section the signal does not pass through by using a monitor apparatus 810.

In a case where encoding and decoding are implemented in all of the regenerative relay apparatuses 802, 803, 804 and

805, the delay time of the section A between the terminal apparatus 800 and the regenerative relay apparatus 802 is regarded as τ; the error rate of the section B between the regenerative apparatuses 802 and 803 is regarded as α; the error rate of the section C between the regenerative apparatuses 803 and 804 is regarded as 2α; the error rate of the section D between the regenerative apparatuses 804 and 805 is regarded as 2α; the error rate of the section E between the regenerative apparatus 805 and the terminal apparatus 801 is regarded as α; and an error correction threshold determined by the monitor apparatus 810 is regarded as 3α.

Figure 13:
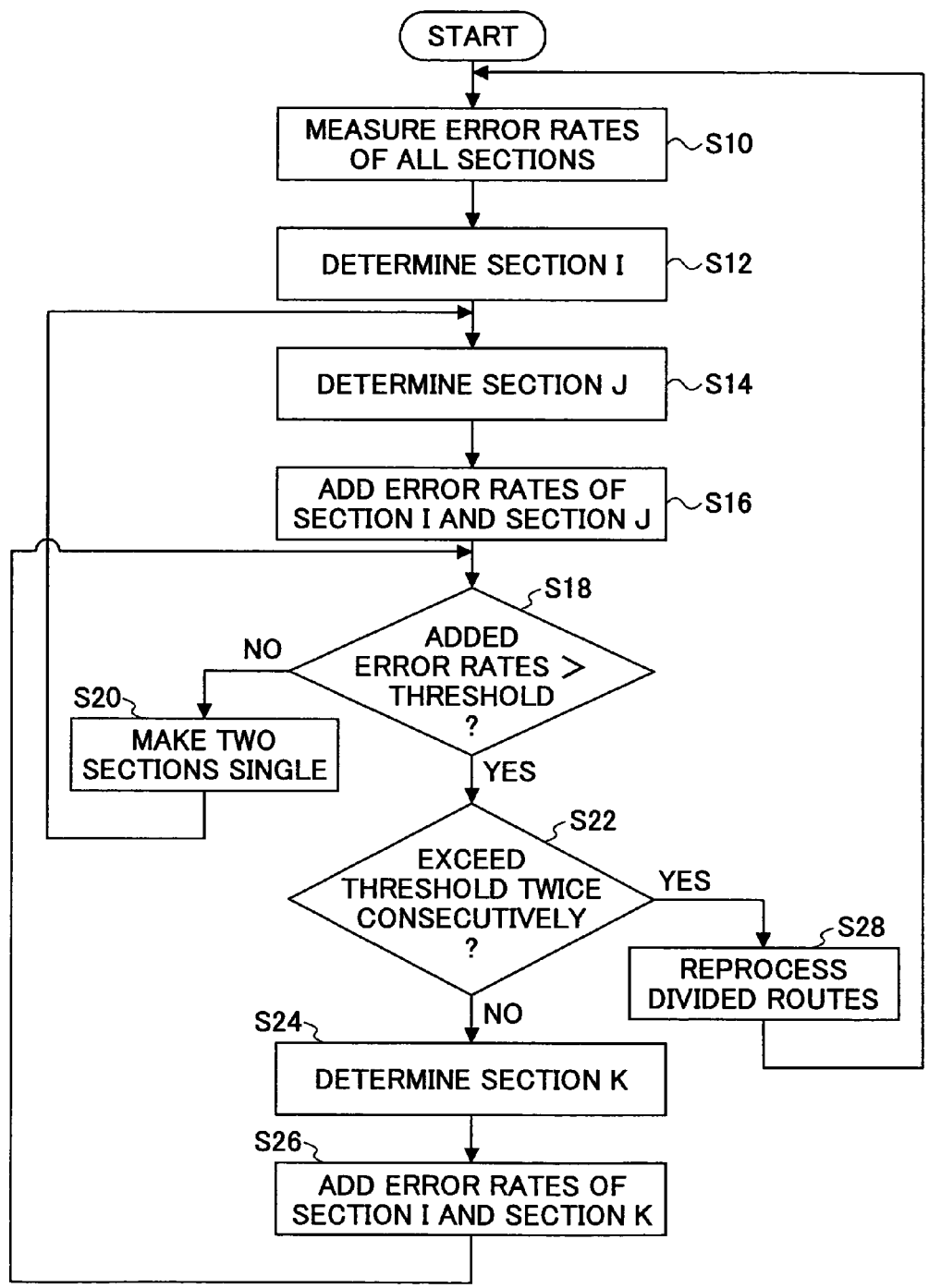
FIG. 13 is a flowchart of an example of a determination process implemented by a monitor apparatus 810.

FIG. 13 is a flowchart of an example of a determination process implemented by the monitor apparatus 810. In FIG. 13, error rates at all of the sections of the route are measured in step S10.

Next, in step S12, a section I where the error rate is highest is determined. In a case where the error rates are the same, a section near the terminal apparatus 800 is selected, for example. In step S14, a section J is determined. The error rate of the section J is highest in two sections neighboring to the section I whose error rate is determined to be highest in step S14. In step S16, the error rates of the section I and Section J are added. In step S18, whether a sum of the error rates exceeds the error correction threshold (3α) is determined.

In a case where the sum of the error rates is lower than the error correction threshold, in step S20, the section I and section J (or the section K) are made to be a single section so that the signal does not pass through the section I and section J of the regenerative relay apparatus and the process goes to step S14.

On the other hand, if the sum of the error rates exceeds the error correction threshold, the process goes to step S22 so that whether the sum of the error rates exceeds the threshold twice consecutively according to the determination in step S18 is determined. If the sum of the error rates exceed the threshold only one time, the process goes to step S24 so that a section K is determined. The error rate of the section K is low in the two sections neighboring to the section I. In step S26, the error rates of the section I and the section K are added and the process returns to step S18 so that whether the sum of the error rates exceed the error correction threshold (3α) is determined.

Whether the sum of the error rates exceeds the threshold twice consecutively is determined in step S22, the section J and the section K neighboring to the section I cannot be made into a single section. Hence, in step S28 the route is divided into two routes in a state where the section I is the boundary and the process returns to step S10 so that the process after step 10 is repeated for the divided routes.

If the determination process shown in FIG. 13 is not implemented such that the error correction threshold is determined from a side of the terminal apparatus 800 in turn, the section A and section B are made single so as to be a new section (the error rate of the new section is 2α) so that encoding and decoding in the regenerative relay apparatus 802 are stopped. Hence, four error correction sections (A+B, C, D, and E) are required.

On the other hand, if the determination process shown in FIG. 13 is implemented, the section B and section C are made single and the section D and section E are made single. Only three error correction sections (A, B+C and D+E) are required so that the delay time can be efficiently reduced.

According to the above-discussed embodiment of the present invention, it is possible to form a network wherein transmission delay is small so that the error correction ability based on compositing and decoding can be used to the maximum. In addition, by reducing the difference of the delay time between the routes, it is possible to reduce the amount of memory necessary for eliminating a phase difference between the routes in the INVERSE-MUX method wherein signals having large capacities are divided into and transmitted by plural routes and at a part after the signals are transmitted, the signals are multiplexed so that the original signal is regenerated.

The present invention is not limited to these embodiments, but variations and modifications may be made without departing from the scope of the present invention.

For example, in the above-discussed embodiments, the error rate is compared with the error correction threshold. Instead of the error rate, the error correction amount may be compared with the error correction threshold.

Either of the first through fourth embodiments may be combined with the either of the fifth through eighth embodiments. The present invention is not limited to this. The decoding part 47, 147, 257, 357, 453, 454, 553, 554, 653, 654, 753, or 754 corresponds to a decoding part mentioned in the following claims. The encoding part 48, 148, 641 or 642 corresponds to an encoding part mentioned in the following claims. The error count part 46, 256, 452 or 652 corresponds to an error count part mentioned in the following claims. The OH receiving part 52, 152, 255, or 355 corresponds to a transfer part mentioned in the following claims. The adder 51, 151, 259 or 359 corresponds to an adding part mentioned in the following claims. The threshold determination part 53, 153 or 260 or the section part 49, 149, 455, or 555 corresponds to a selection part mentioned in the followings claims. The error correction amount count part 146, 356, 557 or 757 corresponds to an error correction amount count part mentioned in the following claims. The threshold determination part 260, 360, 456, or 558 or the OH transmitting part 261, 361, 457, or 559 corresponds to a selection order part mentioned in the following claims. The threshold determination part 656 or 758 or the selection part 655, 755 or 756 corresponds to a comparison selection part mentioned in the following claims. The OH transmitting part 657 or 759 corresponds to a notification part.

What is claimed is:

1. A regenerative relay apparatus comprising:
a decoding part configured to make an error correction of data by using an error correction code;
an encoding part configured to generate another error correction code from data after the error is corrected;
an error count part configured to count an error rate before the error is corrected;
a transfer part configured to transfer the error rate before the error is corrected from a latter apparatus;
an adding part configured to add the error rate in the regenerative relay apparatus and an error rate reported from the latter apparatus by a notifying part; and
a selection part configured to select the error correction code and data before the error is corrected in the regenerative relay apparatus so as to be supplied to the latter apparatus if the added error rates are lower than a designated error correction threshold, and configured to select data after the error is corrected in the regenerative relay apparatus and the other error correction code generated from the data so as to be supplied to the latter apparatus if the added error rates are higher than the designated error correction threshold.

2. A regenerative relay apparatus comprising:
a decoding part configured to make an error correction of data by using an error correction code;
an encoding part configured to generate another error correction code from data after the error is corrected;

an error correction amount count part configured to count an amount of an error corrected by the decoding part;

a transfer part configured to transfer another error correction amount from a latter apparatus;

an adding part configured to add the error correction amount in the regenerative relay apparatus and the other error correction amount reported from the latter apparatus by a notifying part; and a selection part configured to select the error correction code and data before the error is corrected in the regenerative relay apparatus so as to be supplied to the latter apparatus if the added error correction amounts are lower than a designated error correction threshold, and configured to select data after the error is corrected in the regenerative relay apparatus and the other error correction code generated from the data so as to be supplied to the latter apparatus if the added error correction amounts are higher than the designated error correction threshold.

3. A regenerative relay apparatus comprising:

a decoding part configured to make an error correction of data by using an error correction code;

an error count part configured to count an error rate before the error is corrected;

a transfer part configured to transfer the error rate before the error is corrected from a first half apparatus;

an adding part configured to add the error rate in the regenerative relay apparatus and another error rate reported from the first half apparatus by a notifying part; and a selection order part configured to make the first half apparatus select an error correction code and data before the error is corrected in the regenerative relay apparatus so as to be supplied to the regenerative relay apparatus if the added error rates are lower than a designated error correction threshold, and configured to make the first half apparatus select data after the error is corrected in the regenerative relay apparatus and an error correction code generated from the data so as to be supplied to the regenerative relay apparatus if the added error rates are higher than a designated error correction threshold.

4. A regenerative relay apparatus comprising:

a decoding part configured to make an error correction of data by using an error correction code;

an error correction amount count part configured to count an amount of an error corrected by the decoding part;

a transfer part configured to transfer another error correction amount from a first half apparatus;

an adding part configured to add the error correction amount in the regenerative relay apparatus and the other error correction amount reported from the first half apparatus by a notifying part; and a selection part configured to make a selection in the first half apparatus of the error correction code and data before the error is corrected in the regenerative relay apparatus so as to be supplied to the regenerative relay apparatus if the added error correction amounts are lower than a designated error correction threshold, and configured to make the first half apparatus select data after the error is corrected in the regenerative relay apparatus and another error correction code generated from the data so as to be supplied to the regenerative relay apparatus if the added error correction amounts are higher than the designated error correction threshold.

\* \* \* \* \*